(12) United States Patent
Choi et al.

(10) Patent No.: US 10,381,381 B1
(45) Date of Patent: Aug. 13, 2019

(54) DISPLAY WITH LIGHT TRANSMITTING WINDOWS

(71) Applicant: Apple Inc., Cupertino, CA (US)

(72) Inventors: Minhyuk Choi, San Jose, CA (US);
Bhadrinarayana Lalgudi Visweswaran, Princeton, NJ (US);
Cheng Chen, San Jose, CA (US);
Chin-Wei Lin, Cupertino, CA (US);
Meng-Huan Ho, Hsinchu (TW); Rui Liu, San Jose, CA (US); Shih Chang Chang, Cupertino, CA (US); Soojin Park, Santa Clara, CA (US); Sarfaraz Moh, San Jose, CA (US); Jungmin Lee, Cupertino, CA (US); John Z. Zhong, Saratoga, CA (US)

(73) Assignee: Apple Inc., Cupertino ( * ) Notice: Subject to any disclaimer, the term of this patent is extended or adjusted under 35 U.S.C. 154(b) by 48 days.

(21) Appl. No.: 15/274,546

(22) Filed: Sep. 23, 2016

Related U.S. Application Data

(60) Provisional application No. 62/244,112, filed on Oct. 20, 2015.

(51) Int. Cl.
  *H01L 27/12* (2006.01)
  *H01L 31/12* (2006.01)
(52) U.S. Cl.
  CPC ........ *H01L 27/124* (2013.01); *H01L 27/1218* (2013.01); *H01L 27/1288* (2013.01); *H01L 31/12* (2013.01)

(58) Field of Classification Search
  CPC ............. H01L 51/5225; H01L 51/5262; H01L 51/5278; H01L 51/5281; H01L 27/288;
  (Continued)

(56) References Cited

U.S. PATENT DOCUMENTS 8,947,627 B2   2/2015   Rappoport et al.
9,310,843 B2   4/2016   Shedletsky et al.
(Continued)

FOREIGN PATENT DOCUMENTS

EP        2432196        3/2012

*Primary Examiner* — Sue A Purvis
*Assistant Examiner* — Scott Stowe
(74) *Attorney, Agent, or Firm* — Treyz Law Group, P.C.; G. Victor Treyz; David K. Cole

(57) ABSTRACT

A display may have an array of pixels with light-emitting diodes that emit light to form images. The display may have a substrate with thin-film transistor circuitry for supplying signals to the light-emitting diodes. Anodes may be formed on the thin-film transistor circuitry, emissive material may be formed on the anodes, and a cathode layer may overlap the anodes. During operation, currents may flow between the anodes and the cathode layer to illuminate the diodes. An array of electrical components such as an array of light sensors in an integrated circuit may be mounted under the substrate. An array of corresponding light transmitting windows may be formed in the display each of which may allow light to pass through the display to a corresponding one of the light sensors. Light transmitting windows may be formed by patterning the cathode layer and supplying the windows with antireflection layers.

15 Claims, 17 Drawing Sheets

(58) Field of Classification Search
CPC ............ H01L 27/3269; H01L 27/3227; H01L 25/167
See application file for complete search history.

(56) References Cited

U.S. PATENT DOCUMENTS

| | | | |
|---|---|---|---|
| 2006/0180890 A1* | 8/2006 | Naugler, Jr. ........ | H01L 27/3269 257/444 |
| 2008/0284716 A1 | 11/2008 | Edwards et al. | |
| 2011/0227873 A1 | 9/2011 | Chung et al. | |
| 2012/0256089 A1* | 10/2012 | Kanda .................. | G06K 9/0004 250/338.1 |
| 2012/0267611 A1 | 10/2012 | Chung et al. | |

* cited by examiner

DISPLAY WITH LIGHT TRANSMITTING WINDOWS

This application claims the benefit of provisional patent application No. 62/244,112, filed Oct. 20, 2015, which is hereby incorporated by reference herein in its entirety.

BACKGROUND

This relates generally to electronic devices, and, more particularly, to electronic devices with displays.

Electronic devices often include displays. Displays such as organic light-emitting diode displays have pixels with light-emitting diodes. The pixels may be arranged in an array and used to display images for a user.

It may be desirable to incorporate electrical components into an array of pixels. If care is not taken, electrodes and other circuitry in a display may interfere with these components.

It would therefore be desirable to be able to provide improved display arrangements for accommodating electrical components.

SUMMARY

A display may have an array of pixels with light-emitting diodes that emit light to form images. The display may have a substrate with thin-film transistor circuitry. The thin-film transistor circuitry may form pixel circuits that supply signals to the light-emitting diodes.

Anodes may be formed on the thin-film transistor circuitry, emissive material may be formed on the anodes, and a cathode layer may be formed that covers the emissive material. During operation, currents may flow between the anodes and the cathode layer to illuminate the array of diodes in a desired pattern.

An array of electrical components such as an array of light sensors in an integrated circuit may be mounted under the substrate. An array of corresponding light transmitting windows may be formed in the display. The light transmitting windows may be more transparent than other portions of the display. Each light transmitting window may allow light to pass through the display to a corresponding one of the light sensors.

Light transmitting windows may be formed by patterning the cathode layer to create regions of enhanced light transmission. Windows may also be provided with antireflection layers. Techniques for patterning the cathode layer may involve lift-off, shadow masking of the cathode, and laser processing.

Further features will be more apparent from the accompanying drawings and the following detailed description.

DETAILED DESCRIPTION

Figure 1:
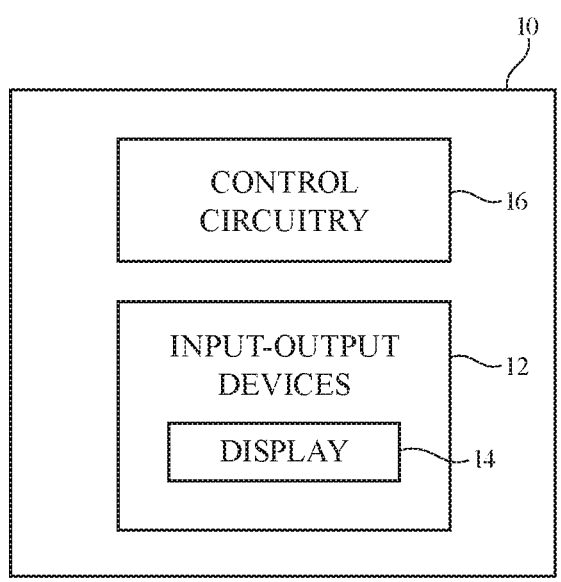
FIG. 1 is a schematic diagram of an illustrative electronic device having a display in accordance with an embodiment.

An illustrative electronic device of the type that may be provided with a display is shown in FIG. 1. Device 10 may be a portable computer, a cellular telephone, a wrist-watch device, a monitor, a desktop computer, a tablet computer, or other suitable electronic equipment. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, and other electrical components. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, light-based touch sensor components, or other suitable touch sensor arrangements.

Control circuitry 16 may be used to run software on device 10 such as operating system code and applications. During operation of device 10, the software running on control circuitry 16 may display images on display 14 using an array of pixels in display 14.

Display 14 may be an organic light-emitting diode display or may be a display based on other types of display technology. Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint), may have an oval or circular shape, or may have other suitable shapes. Display 14 may be planar or may have a curved profile.

Figure 2:
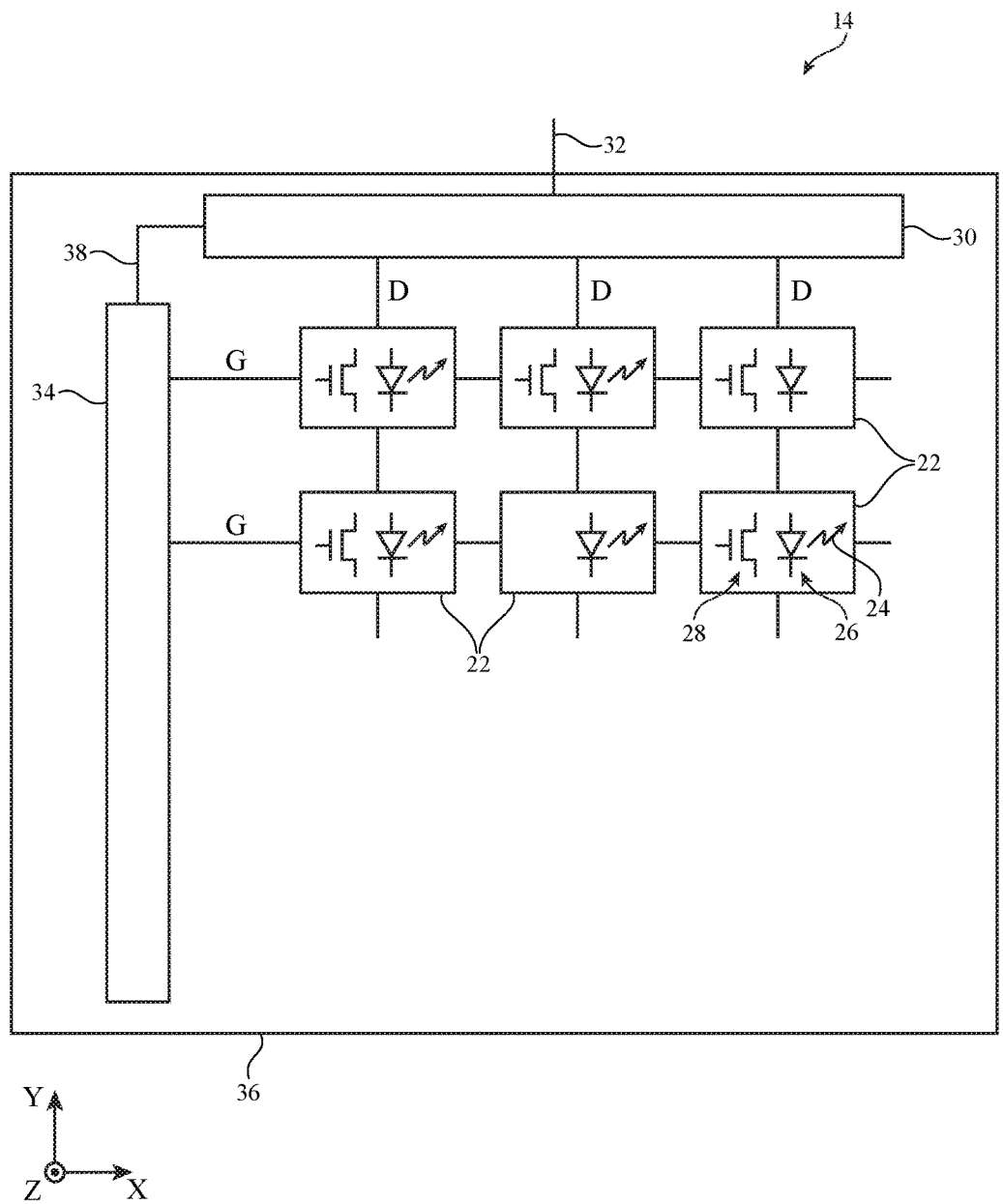
FIG. 2 is a top view of an illustrative display in an electronic device in accordance with an embodiment.

A top view of a portion of display 14 is shown in FIG. 2. As shown in FIG. 2, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel circuit formed from thin-film transistor circuitry such as thin-film transistors 28 and thin-film capacitors). Thin-film transistors 28 may be polysilicon thin-film transistors, semiconducting-oxide thin-film transistors such as indium gallium zinc oxide transistors, or thin-film transistors formed from other semiconductors. Pixels 22 may contain light-emitting diodes of different colors (e.g., red, green, and blue diodes for red, green, and blue pixels, respectively) to provide display 14 with the ability to display color images.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14. In the example of FIG. 2, circuitry 30 is located along the upper edge of display 14 and circuitry 34 is located along the left and/or right edge of display 14. Display driver circuitry may also be provided along different sets of edges or along only a single edge of display 14.

Gate driver circuitry 34 (sometimes referred to as horizontal control line control circuitry) may be implemented as part of an integrated circuit and/or may be implemented using thin-film transistor circuitry. Horizontal control lines G in display 14 may carry gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

Figure 3:
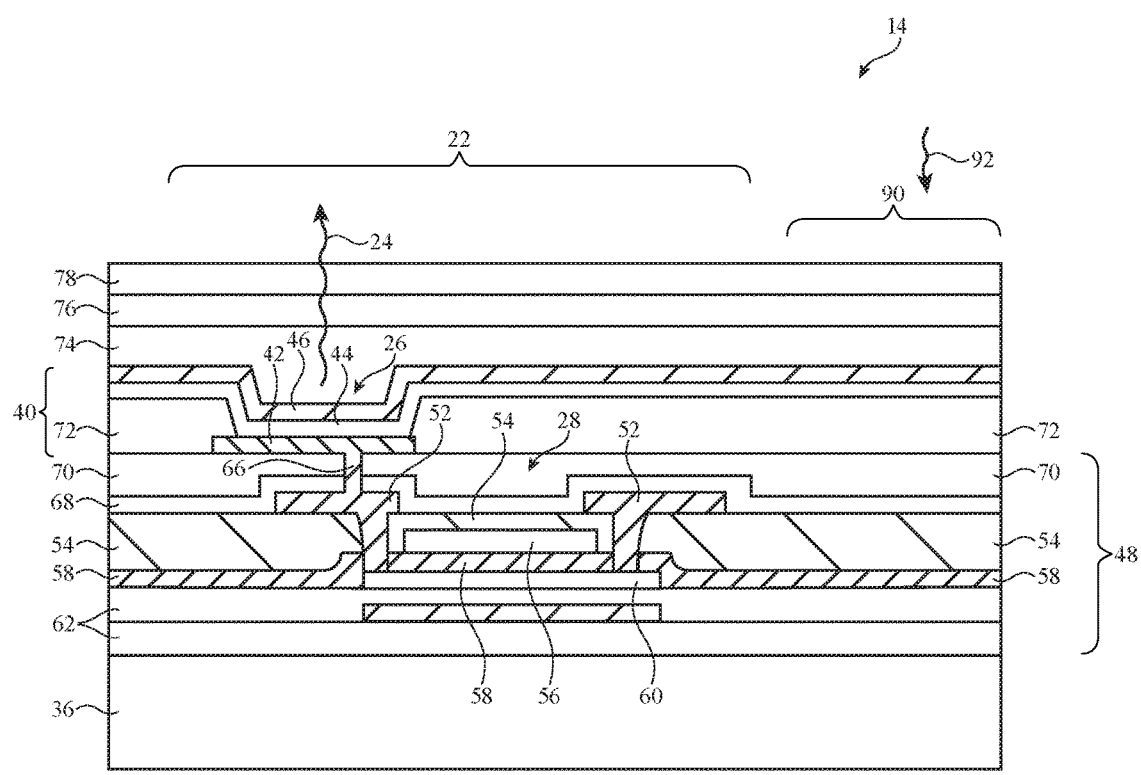
FIG. 3 is a cross-sectional side view of a portion of an illustrative organic light-emitting diode display in accordance with an embodiment.

A cross-sectional side view of a portion of an illustrative organic light-emitting diode display that includes a light-emitting diode (diode 26) and thin-film transistor circuitry for an associated pixel circuit (thin-film transistor circuitry 48) is shown in FIG. 3. As shown in FIG. 3, display 14 may include a substrate layer such as substrate layer 36. Substrate 36 may be a planar layer or a non-planar layer and may be formed from plastic (e.g., a sheet of polyimide or other polymer), glass, ceramic, sapphire, metal, or other suitable materials. The surface of substrate 36 may, if desired, be covered with one or more buffer layers 62.

A pixel circuit may be formed from thin-film circuitry 48 on substrate 36. The thin film transistor circuitry may include transistors, capacitors, and other thin-film structures. As shown in FIG. 3, a transistor such as thin-film transistor 28 may be formed from thin-film semiconductor layer 60. Semiconductor layer 60 may be a polysilicon layer, a semiconducting-oxide layer such as a layer of indium gallium zinc oxide, or other semiconductor layer. Gate layer 56 may be a conductive layer such as a metal layer that is separated from semiconductor layer 60 by an intervening layer of dielectric such as dielectric 58 (e.g., an inorganic gate insulator layer such as a layer of silicon oxide and/or silicon nitride). Dielectric 62 (e.g., one or more buffer layers) may be used to separate semiconductor layer 60 from substrate 36. Underlying structures such as shield layer 64 may be formed under gate 56 (e.g., between buffer layers 62). Layers 62 may be formed from inorganic dielectric materials such as silicon oxide and/or silicon nitride, or may be formed form other insulating materials.

Semiconductor layer 60 of transistor 28 may be contacted by source and drain terminals formed from source-drain metal layer 52. One or more interlayer dielectric layers or other insulating material such as dielectric layer 54 (e.g., an inorganic dielectric layer with one or more sublayers of material such as silicon oxide, silicon nitride, etc.) may separate gate metal layer 56 from source-drain metal layer 52. A dielectric passivation layer (e.g., a layer of silicon oxide or other inorganic layer) such as passivation layer 68 may cover source-drain metal layer 52.

Thin-film transistor circuitry 48 (e.g., source-drain metal layer 52) may be shorted to anode 42 of light-emitting diode 26 using a metal via such as via 66 that passes through dielectric planarization layer 70 and passivation layer 68. Passivation layer 68 may be formed from a layer of inorganic dielectric (as an example). Planarization layer 70 may be formed from an organic dielectric material such as a polymer. The thickness of planarization layer 70 may be 2 microns, 1-3 microns, less than 4 microns, more than 1.5 microns, or other suitable thickness. The index of refraction of layer 70 may be about 1.5.

Light-emitting diode 26 is formed from thin-film circuitry such as light-emitting diode layers 40 on thin-film transistor circuitry 48. Each light-emitting diode has a lower electrode and an upper electrode. In a top emission display, the lower electrode may be formed from a reflective conductive material such as patterned metal to help reflect light that is produced by the light-emitting diode in the upwards direction out of the display. The upper electrode (sometimes referred to as the counter electrode) may be formed from a transparent or semi-transparent conductive layer (e.g., a thin layer of transparent or semitransparent metal and/or a layer of indium tin oxide or other transparent conductive material). This allows the upper electrode to transmit light outwards that has been produced by emissive material in the diode. In a bottom emission display, the lower electrode may be transparent (or semi-transparent) and the upper electrode may be reflective.

In configurations in which the anode is the lower electrode, layers such as a hole injection layer, hole transport layer, emissive material layer, and electron transport layer may be formed above the anode and below the upper electrode, which serves as the cathode for the diode. In inverted configurations in which the cathode is the lower electrode, layers such as an electron transport layer, emissive material layer, hole transport layer, and hole injection layer may be stacked on top of the cathode and may be covered with an upper layer that serves as the anode for the diode. Both electrodes may reflect light.

In general, display 14 may use a configuration in which the anode electrode is closer to the display substrate than the cathode electrode or a configuration in which the cathode electrode is closer to the display substrate than the anode electrode. In addition, both bottom emission and top emission arrangements may be used. Top emission display configurations in which the anode is located on the bottom and the cathode is located on the top are sometimes described herein as an example. This is, however, merely illustrative. Any suitable display arrangement may be used, if desired.

In the illustrative configuration of FIG. 3, display 14 has a top emission configuration and lower electrode 42 is an anode and upper electrode 46 is a cathode. Layers 40 include a patterned metal layer that forms anodes such as anode 42. Each anode 42 is formed under a respective opening in pixel definition layer 72. Pixel definition layer 72 may be formed from a patterned photoimageable polymer (e.g., polyimide).

In each light-emitting diode, organic emissive material 44 is interposed between a respective anode 42 and cathode 46. The thickness of material 44 may be about 140 nm or other suitable thickness. Anodes 42 may be patterned from a layer of metal on planarization layer 70. Cathode 46 may be formed from a common conductive layer that is deposited on top of pixel definition layer 72 and that overlaps diodes 26. Cathode 46 is transparent so that light 24 may exit light emitting diode 26 as current is flowing through emissive material 44 between anode 42 and cathode 46.

Organic light-emitting diode display structures such as the layer of emissive material 44 and other thin-film circuitry in display 14 may be sensitive to moisture. Accordingly, organic light-emitting diode layers 40 may be covered with encapsulation layers such as layer 74. Encapsulation layer 74 may include organic and inorganic sublayers that serve as moisture barrier materials, planarization layers, adhesive layers, buffer layers, and other structures for protecting diode 26, transistor 28, and other thin-film circuitry in display 14.

If desired, display 14 may have a protective outer display layer such as cover layer 78. The outer display layer may be formed from a material such as sapphire, glass, plastic, clear ceramic, or other transparent material.

Functional layers 76 may be interposed between layer 74 and cover layer 78. Functional layers 76 may include a touch sensor layer, a circular polarizer layer, and other layers. A circular polarizer layer may help reduce light reflections from reflective structures such as anodes 42 and/or other thin-film circuitry in display 14. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover layer 78 and functional layers 76 to underlying display layers such as layer 74. If desired, touch sensor electrodes may be incorporated into the thin-film layers of light-emitting diode layer 40 and/or thin-film transistor circuitry 48.

Organic layer 44 may include an organic emissive layer (e.g., a red emissive layer in red diodes 26 that emits red light, a green emissive layer in green diodes 26 that emits green light, and a blue emissive layer in blue diodes 26 that emits blue light, etc.). The emissive material may include a material such as a phosphorescent material or fluorescent material that emits light during diode operation. Quantum dots may be used to form quantum dot light emitting diodes.

Display 14 may contain an array of pixels 22 to display images. In some areas of display 14 such as area 90, the structures of display 14 may be configured to form a transparent area. The transparent area may be more transparent than surrounding portions of display 14 and may therefore sometimes be referred to as a region of enhanced transparency or enhanced light transmission, an optical window, a transparent window, a light transmitting window, or a light window (as examples). Windows such as window 90 of FIG. 3 may be formed in an array, in a single location on display 14, in a sparse array pattern or other pattern that is interspersed with a portion or all of the array of pixels 22 in display 14, or may be located in other suitable portions of display 14. During operation of device 10, light from outside of device 10 such as light 92 may pass through window 90 and may be received by a light sensor or other light-based component in device 10 (e.g., a part of a light sensor array integrated circuit or other device that is located within the interior of device 10 under display 14). Light 92 may be light 24 from display 14 that has reflected from an external object, may be ambient light, may be light that has been emitted by device 10 without using pixels 22 of display 14, or may be other suitable light. If desired, light may pass outwardly through window 90 (e.g., from a light-emitting diode, laser, or other light source inside device 10).

Figure 4:
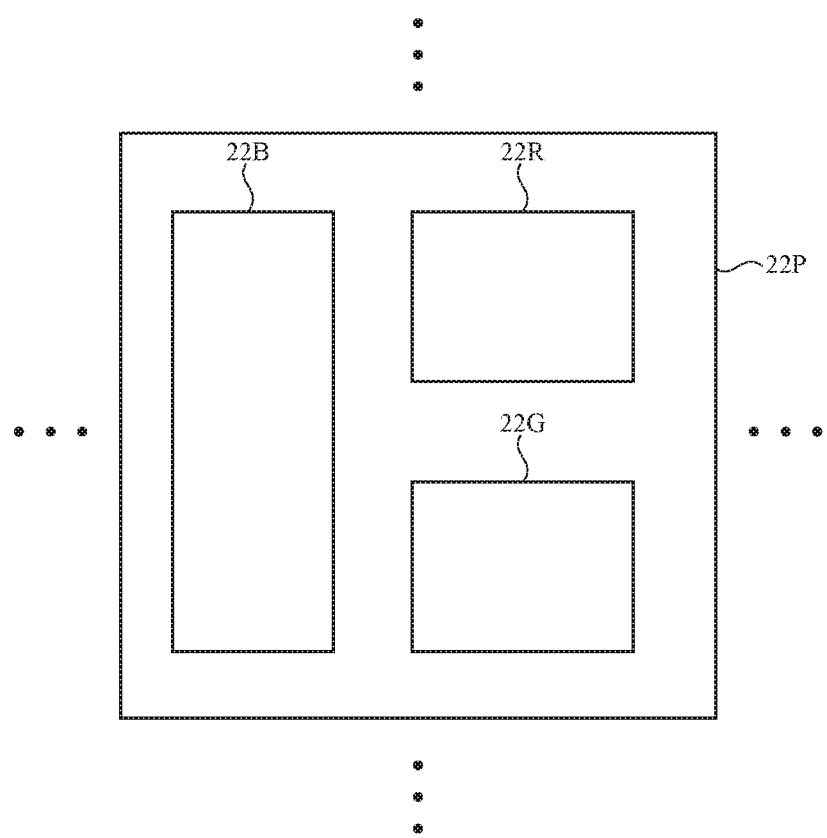
FIG. 4 is diagram of an illustrative pixel cell having pixels of different colors in accordance with an embodiment.

Display 14 may have an array of pixels 22 of different colors to provide display 14 with the ability to display color images. As shown in FIG. 4, each pixel cell 22P in display 14 may contain a red pixel 22R, a green pixel 22G, and a blue pixel 22B (as an example). These pixels, which may sometimes be referred to as subpixels, may have rectangular emissive areas (e.g., rectangular anode shapes) and/or may have emissive areas of other suitable shapes. White pixels, yellow pixels, and pixels of other colors may also be included in display 14, if desired.

Figure 5:
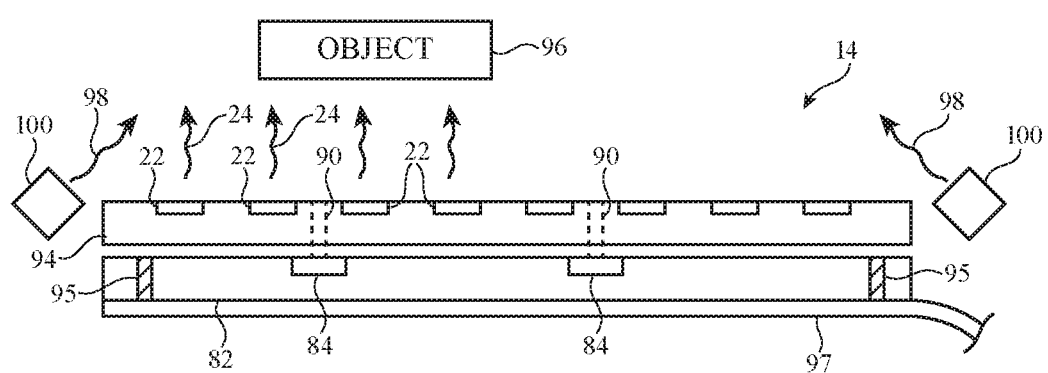
FIG. 5 is a cross-sectional side view of a display with an array of electrical components in accordance with an embodiment.

It may be desirable to incorporate electrical components into display 14 and/or device 10. As shown in FIG. 5, for example, electrical components 84 may be mounted under display layers 94 (e.g., a substrate, thin-film transistor circuitry, light-emitting diode circuitry, etc.). Electrical components 84 may be audio components (e.g., microphones, speakers, etc.), radio-frequency components, haptic components (e.g., piezoelectric structures, vibrators, etc.), may be capacitive touch sensor components or other touch sensor structures, may be temperature sensors, pressure sensors, magnetic sensors, or other sensors, or may be any other suitable type of electrical component. With one suitable arrangement, which may sometimes be described herein as an example, electrical components 84 may be light-based components (e.g., components that emit and/or detect visible light, infrared light, and/or ultraviolet light).

Components 84 may be light sensors and/or light emitters that are aligned with corresponding windows 90. Components 84 may, as an example, be light sensors that are formed as part of a common integrated circuit such as device 82 (e.g., a light-sensor integrated circuit, sometimes referred to as a camera or light sensor array). Device 82 may have through-silicon vias such as vias 95 to couple front-side circuitry (e.g., circuitry including components 84) to metal traces on substrate 97. Substrate 97 may be a printed circuit (e.g., a rigid printed circuit board formed from a rigid printed circuit board material such as fiberglass-filled epoxy or a flexible printed circuit formed from a flexible layer of polyimide or other sheet of polymer). Device 82 or one or more discrete light sensors may be mounted on substrate 97 using solder connections, anisotropic conductive film connections, or connections formed using other conductive material. If desired, components 84 and/or device 82 may be integrated into the layers that make up display 14 and/or may be mounted in alignment with display 14.

Light-based components 84 may emit and/or detect light that passes through transparent windows 90 in display 14. Windows 90 may be formed in regions located between pixels 22 and may include transparent materials (e.g., clear plastic, glass, etc.) and/or holes (e.g., air-filled openings or openings filled with transparent material that pass partly or fully through substrate 36 and other display layers 94 of display 14). There may be a window 90 between each pair of pixels 22 or, more preferably, there may be a window 90 may be associated with a set of multiple pixels 22 (e.g., a set of tens, hundreds, or thousands of pixels). In some configurations, windows 90 may be formed in an array in a portion of display 14.

Examples of light-based components 84 that emit light include light-emitting diodes (e.g., organic light-emitting diodes, discrete crystalline light-emitting diode dies, etc.), lasers, and lamps. Examples of light-based components that detect light include light detectors such as photodiodes and phototransistors. Some components may, if desired, include both light emitters and detectors. For example, components 84 may emit infrared light or light at other wavelengths and may include light detector structures for detecting a portion of the emitted light that has reflected from nearby objects such as object 96. Components of this type may be used to implement a proximity detector, a light-based fingerprint sensor (e.g., when object 96 is the finger of a user), or other light-based sensor. If desired, light-based sensors such as these may be implemented by illuminating object 96 with light 24 from one or more of pixels 22 and/or light 98 from one or more supplemental light sources such as discrete light-emitting diodes 100, while using light-detecting components 84 to gather reflected light from object 86.

Control circuitry 16 may be used in controlling the emission of light from light sources such as pixels 22, components 84, and/or light sources 100 and may be used in processing corresponding detected light from components 84 (e.g., to generate a proximity sensor signal based on light reflected from object 96, to generate a fingerprint reading based on light reflected from object 96, to process a captured digital image of a far-field object that is captured using components 84, etc.).

Cathode 46 is preferably formed from a conductive material that is sufficiently transparent to allow light 24 to be emitted from pixel 22, as shown in FIG. 3. As an example, cathode 46 may be formed from a thin layer of metal (e.g., a metal alloy) such as silver magnesium silver (AgMg). Arrangements in which cathode 46 is formed from silver or other metals, wide bandgap semiconductors such as indium tin oxide that serve as transparent conductors, or other conductive materials may also be used, if desired. If the thickness of cathode 46 is sufficiently small (e.g., 20-30 nm or other suitable thickness for an illustrative AgMg cathode), cathode 46 will have a transmittance of 50% or more (as an example).

If desired, the transmittance of windows 90 can be enhanced relative to the transmittance of other portions of display 14 by modifying the portions of cathode 46 that overlap windows 90 and/or by modifying other portions of display 14 in windows 90.

With one suitable arrangement, portions of cathode 46 may be selectively removed to form windows 90. Windows 90 formed from cathode-free areas of display 14 may exhibit higher light transmission than areas of display 14 that are covered with cathode material. The cathode-free areas may therefore serve as effective light transmission windows for components 84.

FIGS. 6, 7, 8, and 9 show how a lift-off technique may be used in forming regions of display 14 that do not include cathode material and which therefore exhibit enhanced transmittance for windows 90.

Figure 6:
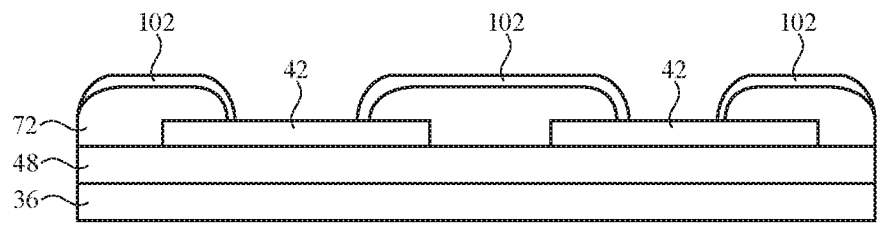
FIGS. 6, 7, 8, and 9 are cross-sectional side views of a display that is being fabricated using lift-off techniques to create optical windows to accommodate light-based electrical components in accordance with an embodiment.

As shown in FIG. 6, in a first process step, a passivation layer such as passivation layer 102 may be used to cover pixel definition layer 72. Passivation layer 102 may be formed from an inorganic dielectric or other suitable masking material. The presence of passivation layer 102 may help protect pixel definition layer 72 from damage during wet etching operations.

Figure 7:
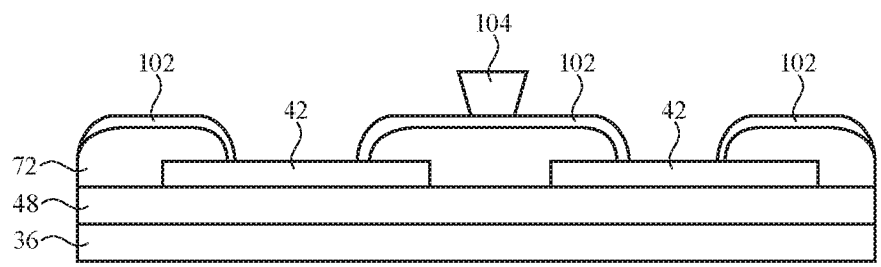
Figure 8:
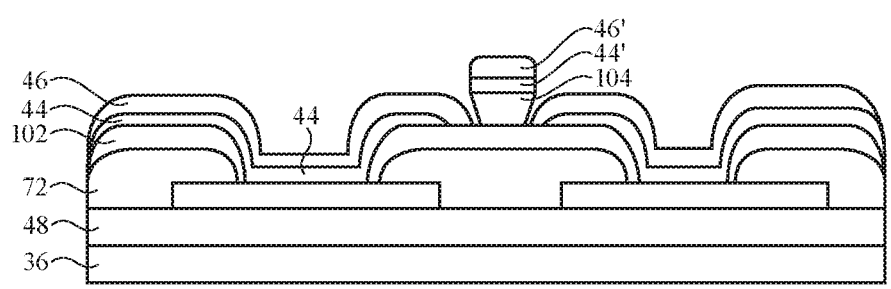

As shown in FIG. 7, photoresist 104 (e.g., a photoimageable polymer) can then be deposited and patterned on a portion of display 14 that does not overlap one of anodes 42 or other light-blocking thin-film circuit structures. For example, photoresist 104 may be placed in a location between pixels 22 (i.e., between light-emitting diodes 26).

Organic emissive layer 44 and cathode layer 46 may then be deposited. The thickness of cathode layer 46 may be about 20-30 nm or other suitable thickness.

Figure 9:
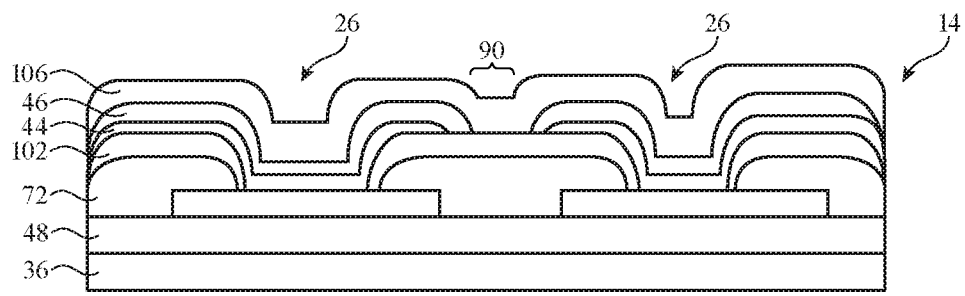

Due to the presence of photoresist 104, portion 44' of emissive material layer 44 and portion 46' of blanket cathode layer 46 can be removed by a lift off process (e.g., photoresist 104, portion 44', and portion 46' may be removed by exposure to liquid photoresist solvent). The removal of these structures creates an opening in cathode layer 46 that forms window 90 of FIG. 9. As shown in FIG. 9, one or more layers such as layer 106 (e.g., one or more layers such as layers 74, 76, and 78 of FIG. 3) may cover display 14 after formation of window 90. Windows in display 14 such as window 90 of FIG. 9 may be free of opaque structures such as opaque anode metal.

Multiple lift-off operations may be performed if it is desired to cap the maximum cathode layer film thickness that is removed in any one lift-off operation. The illustrative lift-off process of FIGS. 6, 7, 8, and 9 uses a single lift-off operation.

Figure 10:
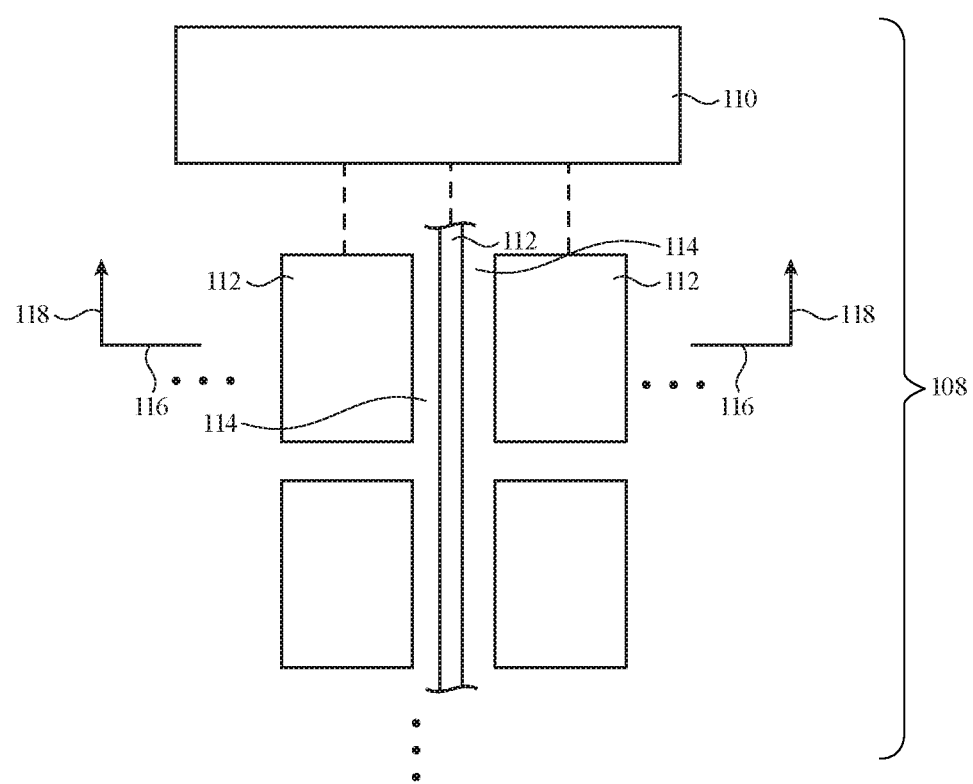
FIG. 10 is a top view of an illustrative touch sensor in accordance with an embodiment.

If desired, patterned islands of photoresist such as photoresist 104 may be used in connection with dry processing techniques to pattern conductive layers such as cathode 46. For example, these techniques may be to pattern transparent conductive material (AgMg or other thin metal layers, indium tin oxide, etc.) in touch sensors for displays. The touch sensors may be capacitive touch sensors that are integrated into displays and/or that are formed on separate touch panel substrates. Consider, as an example, capacitive touch sensor 108 of FIG. 10. Touch sensor circuitry 110 may process signals from transparent conductive capacitive touch sensor electrodes 112 to gather information on touch gestures and other touch input from a user of device 10. Electrodes 112 may also serve as a part of the cathode for pixels 22 (i.e., cathode 46).

Electrodes 112 may have any suitable shapes (squares, diamonds, horizontal and/or vertical strips, etc.). To separate adjacent electrodes 112 from each other, gaps such as gap 114 may be formed.

Figure 11:
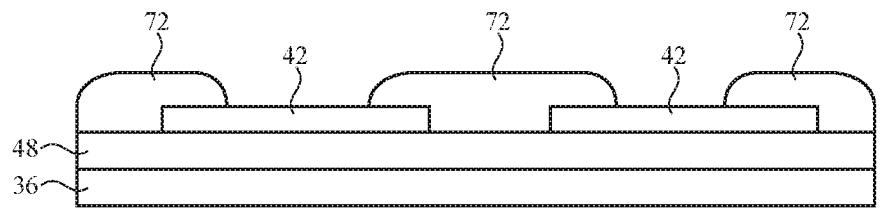
FIGS. 11, 12, and 13 are cross-sectional side views of a display showing how touch sensors may be fabricated in accordance with an embodiment.
Figure 12:
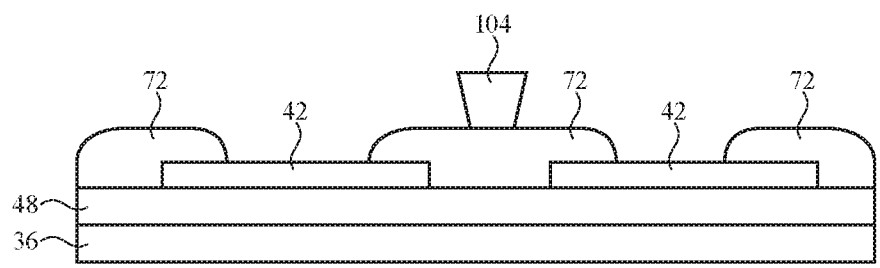
Figure 13:
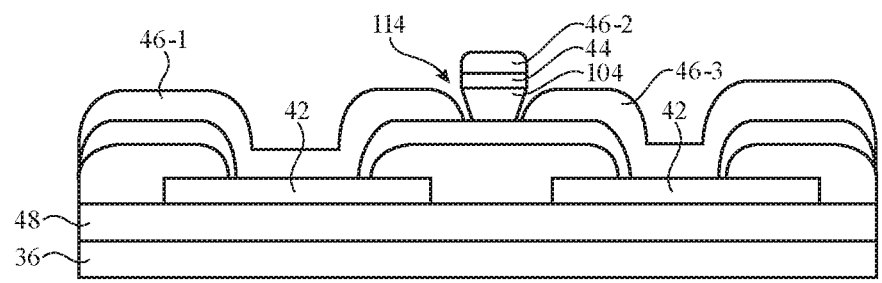

FIGS. 11, 12, and 13 show how photoresist 104 may be used in forming gaps 114. A cross-sectional side view of illustrative touch sensor 108 of FIG. 10 taken along line 116 and viewed in direction 118 is shown in FIG. 11. In the arrangement of FIG. 11, pixel definition layer 72 has been deposited on thin-film transistor circuitry 48 on substrate 36. If desired, layer 72 may be a patterned polymer layer on other types of substrate. The use of a display substrate in the example of FIG. 11 is merely illustrative.

FIG. 12 is a cross-sectional side view of the structures of FIG. 11 following deposition and patterning of photoresist 104 onto a region of pixel definition layer 72 between adjacent anodes 42.

As shown in the cross-sectional side view of FIG. 13, after patterned photoresist 104 has been formed, emissive layer 44 and cathode layer 46 may be deposited. The shape of photoresist 104 prevents the material of cathode layer 46 from depositing in gaps 114, thereby separating the cathode into cathode portions 46-1, 46-2, and 46-3 (e.g., to form respective capacitive touch sensor electrodes 112 of FIG. 10). If desired, the electrodes formed from cathode portions 46-1 and 46-2 may be used in handling current flowing through respective first and second sets of one or more light-emitting diodes 26 in corresponding pixels 22 for display 14. Techniques of the type shown in FIGS. 11, 12, and 13 may also be used to pattern touch sensor electrodes in touch sensor panels that do not contain any pixels. The example of FIGS. 11, 12, and 13 in which conductive cathode layer structures are used both to form diode cathodes and capacitive touch sensor electrodes is presented as an example.

If desired, shadow masking techniques may be used to pattern layers of display 14 such as cathode layer 46 to form cathode-free regions for windows 90.

Figure 14:
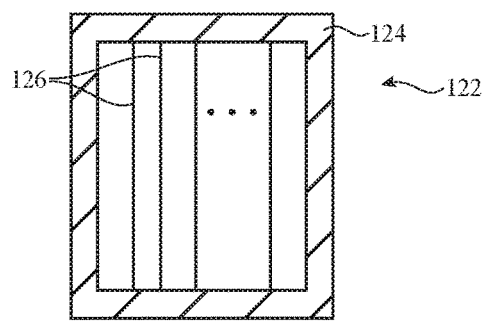
FIG. 14 is a top view of an illustrative shadow mask with vertical mask elements that may be used during a first cathode layer deposition operation in accordance with an embodiment.
Figure 15:
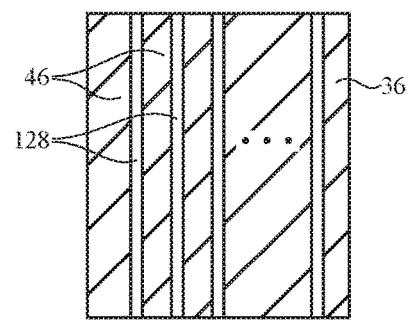
FIG. 15 is a top view of a display in which a cathode layer has been deposited through a shadow mask of the type shown in FIG. 14 to create vertical strips that are free of cathode material in accordance with an embodiment.

An illustrative shadow mask with vertically oriented mask elements is shown in FIG. 14. Mask 122 may have a frame such as frame 124. Vertical mask elements 126 may extend vertically (in the orientation of FIG. 14) across frame 124. Mask elements 126 may be high tension string-shaped elements (e.g., metal wire, carbon fibers coated with metal, etc.). Elements 126 that are formed from fibers may have diameters of about 3-10 microns (as an example). There may be hundreds of fibers or other elongated mask elements 126 in mask 122.

Mask 122 may be used as a shadow mask when depositing cathode 46 (e.g., by physical vapor deposition). This creates vertical strips of cathode 46 separated by respective gaps 128 (e.g., narrow gaps having widths comparable to the horizontal dimensions of elements 126).

Figure 16:
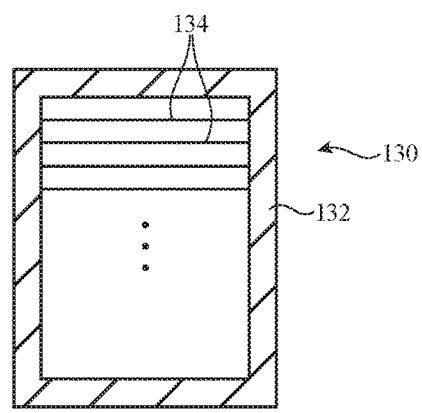
FIG. 16 is a top view of an illustrative shadow mask with horizontal mask elements that may be used during a second cathode layer deposition operation in accordance with an embodiment.
Figure 17:
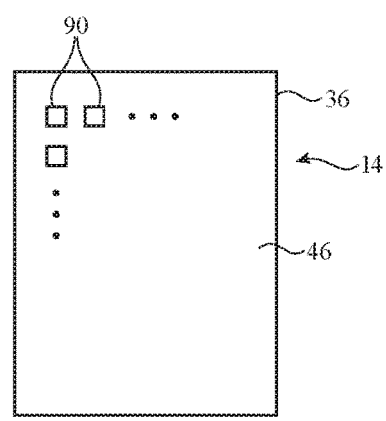
FIG. 17 is a top view of an illustrative display following cathode layer deposition operations using the masks of FIGS. 14 and 16 in accordance with an embodiment.

A second layer of cathode material may then be deposited through a second shadow mask such as shadow mask 130 of FIG. 16. Shadow mask 130 may have horizontal mask elements 134 (e.g., fibers such as metal wire, carbon-fiber strands coated with metal, etc.). Elements 134 may run perpendicular to elements 126, so that following deposition of the second layer of cathode material, cathode 46 has a pattern of the type shown in FIG. 17. As shown in FIG. 17, cathode-free windows 90 have been created in an array of locations corresponding to the positions at which elements 126 and perpendicular elements 134 intersect and overlap. In these locations, cathode material from the first shadow mask deposition operation was blocked by elements 126 and cathode material from the second shadow mask deposition operation was blocked by elements 134, resulting in an array of cathode-free areas.

Figure 18:
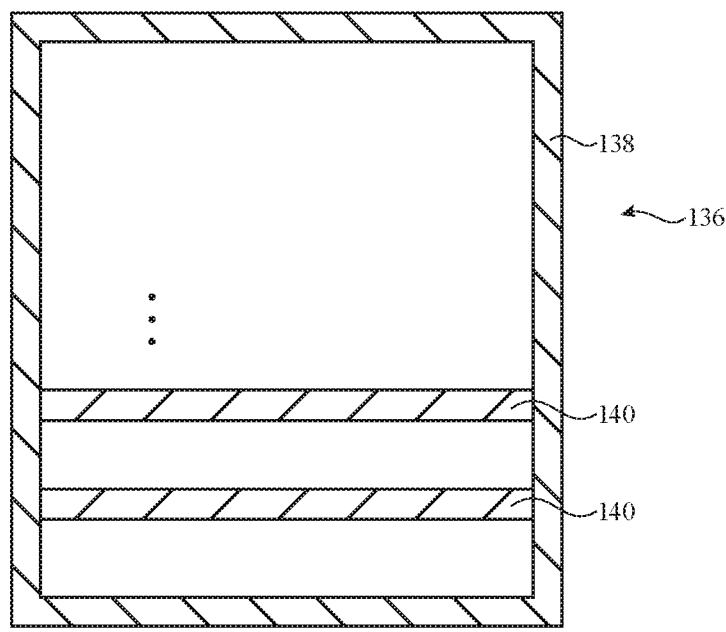
FIG. 18 is a top view of an illustrative shadow mask with horizontal masking strips in accordance with an embodiment.

In the illustrative configuration of FIG. 18, cathode shadow mask 136 has horizontal masking elements such as strip-shaped masking elements 140 that are supported by frame 138. Mask 136 may be a fine metal mask that blocks cathode deposition along horizontally extending strips such as strip 142 of FIG. 19. Strips 142 create cathode-free areas where windows 90 may be formed on display 14, but create a potential for electrical isolation between respective portions of cathode 46.

Figure 19:
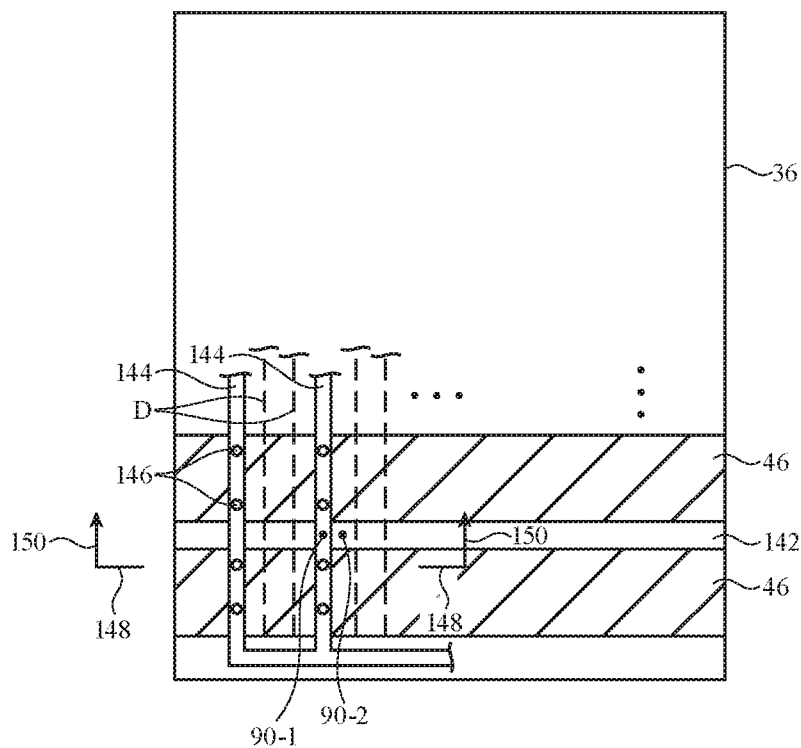
FIG. 19 is a top view of an illustrative display having horizontal strips of cathode material that have been formed using a mask of the type shown in FIG. 18 and that includes vertical metal lines that short the horizontal strips together in accordance with an embodiment.

To electrically short these horizontal strips of cathode 46 together, vertical metal lines such as lines 144 of FIG. 19 (sometimes referred to as ELVSS lines) may be provided on display 14. Lines 144 may be coupled to regions of cathode layer 46 using vias 146, thereby forming a single electrically connected cathode for display 14. Light transmitting windows 90 may be located in regions of display 14 that are free of cathode material such as location 90-1 (e.g., in an opening in an ELVSS line) and location 90-2. Data lines D and other display routing lines may extend throughout display 14 in portions that do not overlap the light transmitting windows (e.g., data lines D may run vertically between respective ELVSS lines).

Figure 20:
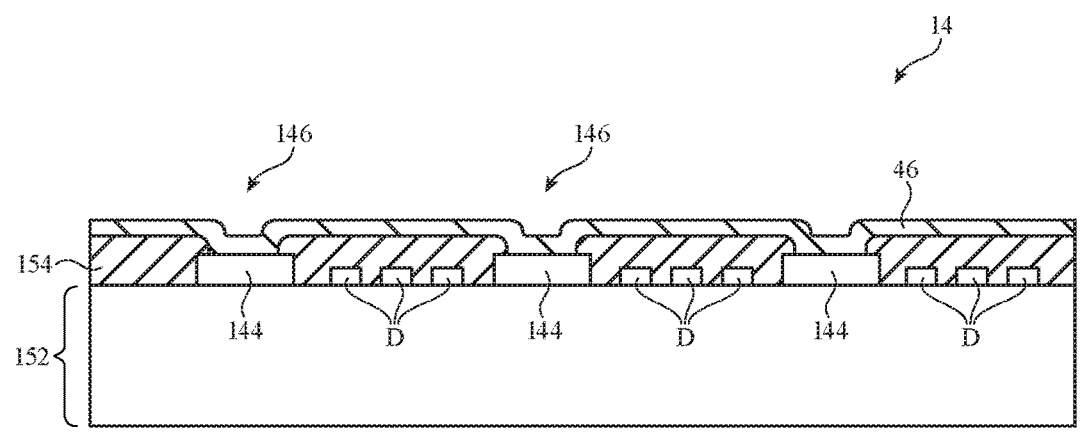
FIG. 20 is a cross-sectional side view of the display of FIG. 19 showing how cathode material may be shorted to metal lines in accordance with an embodiment.

A cross-sectional side view of a portion of display 14 of FIG. 19 taken along line 148 and viewed in direction 150 is shown in FIG. 20. Data lines D and ELVSS lines 144 may be formed from patterned portions of source-drain metal layer 52 or other suitable metal layer on display 14. Layers 152 may include a substrate layer and thin-film layers of the type shown in FIG. 3. Dielectric layer 154 may be an inorganic and/or organic layer within the thin-film layers of display 14. Openings in dielectric 154 may form vias 146 to short cathode layer 46 to lines 144 and thereby ensure that the cathode voltage distributed by the cathode in display 14 is uniform. If desired, an ELVSS metal ring may surround the periphery of display 14 to help enhance cathode voltage uniformity.

Figure 21:
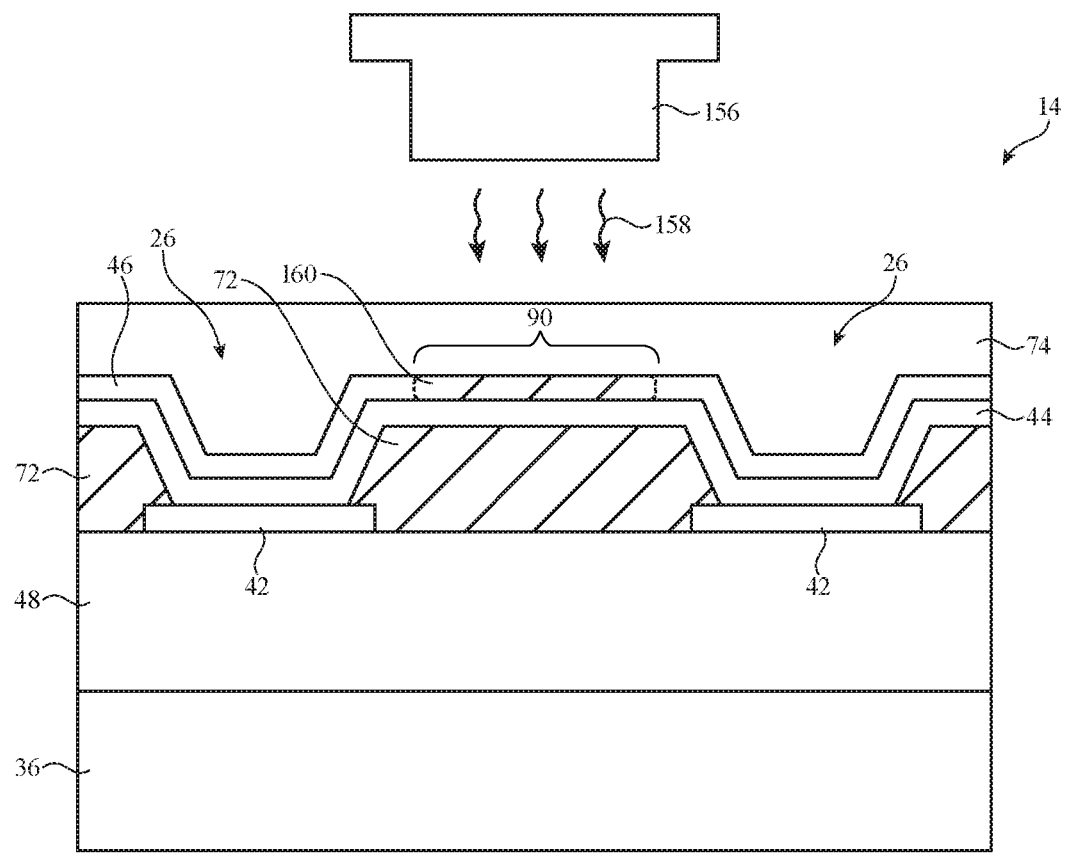
FIGS. 21 and 22 are cross-sectional side views of displays being processed using illustrative laser processing systems to form optically transparent windows in the displays in accordance with an embodiment.

Laser processing techniques may be used to form some or all of windows 90. In the example of FIG. 21, laser system 156 is producing laser light 158. Light 158 may be divided into multiple parallel beams using an optical system formed from a grating that creates an M×N pattern of light beams and an associated focusing lens. Light 158 may also be generated in individual spots (e.g., by using a movable mirror, translation stages, and/or other systems for steering light 158 into desired areas on display 14). Light 158 may be ultraviolet light, visible light (e.g., green light at 532 nm in wavelength), or infrared light. Light 158 may be pulsed or may be continuous. Light 158 is preferably strongly absorbed by cathode 46 and minimally absorbed by intervening layers such as encapsulation layer 74. Light 158 may be focused to a spot size of 1 to 250 square microns or other suitable size.

Figure 22:
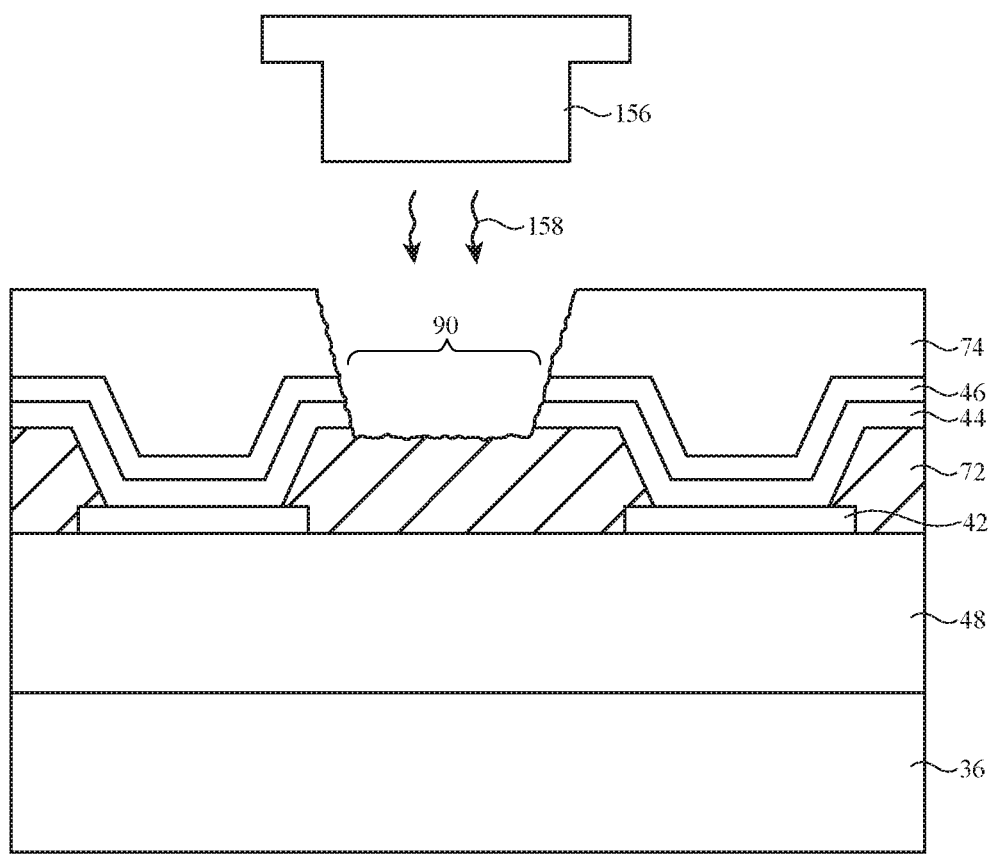

When exposed to light 158, portion 160 of cathode 46 may be heated and otherwise modified so as to interact with adjacent materials (e.g., to form a light-transparent aggregate incorporating materials from layers such as emissive layer 44 and/or encapsulation layer 74). When converted to a transparent form in this way, portion 160 of cathode 46 can serve as a transparent layer within window 90. If desired, light 158 may be applied with sufficient intensity (e.g., in energetic short pulses) to ablate material from display 14, thereby creating a physical opening through layer 46 for window 90 (FIG. 22).

Figure 23:
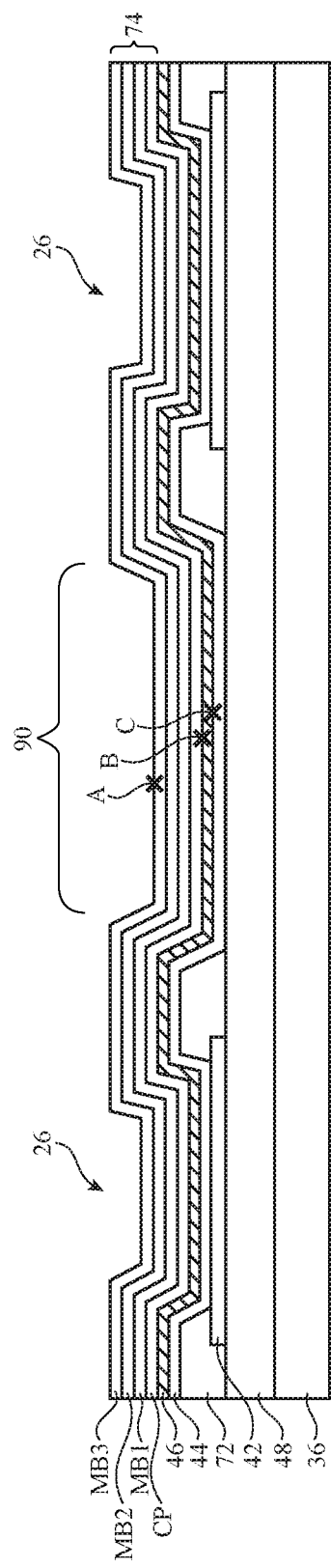
FIG. 23 is a cross-sectional side view of a portion of a display showing how antireflection structures may be used to create optically transparent windows in the display in accordance with an embodiment.

If desired, antireflection structures may be provided over portions of display 14 to create light-transmitting windows 90. This type of arrangement is shown in the cross-sectional side view of display 14 of FIG. 23. As shown in FIG. 23, display 14 may have thin-film transistor circuitry 48 on substrate 36. Anodes 42, pixel definition layer 72, and cathode 46 may be formed on circuitry 48. Encapsulation layer 74 may include layers such as organic capping layer CP and moisture barrier layers MB1, MB2, and MB3. Capping layer CP may be an organic layer having a thickness of about 50 nm. Moisture barrier layer MB1 may be an inorganic dielectric layer such as a 1.5 micron layer of silicon nitride. Moisture barrier layer MB2 may be a dielectric layer such as an 18 micron organic layer. Moisture barrier layer MB3 may be an inorganic dielectric layer such as a 1.5 micron silicon nitride layer.

To form an antireflection structure that enhances transparency through display in window region 90, dielectric antireflection layers may be selectively introduced above and below cathode 46 in window region 90. For example, a 97.5 nm silicon oxide layer may be formed at location A above layer MB3, a 157.1 nm layer of silicon oxide may be formed at location B between layer CP and cathode 46, and a 40.1 nm silicon nitride layer may be formed at location C between cathode layer 46 and emissive material 44.

The total number of antireflection layers used for windows 90 and the thicknesses, locations, indices of refraction, and materials used in forming the additional antireflection layers for windows 90 may be adjusted to ensure visible light transparency or non-visible light transparency in a desired range of wavelengths. For example, three antireflection layers were incorporated into the window areas of display 14 of FIG. 23, but more than three layers or fewer than three layers (e.g., two or more layers, etc.) may be used. Antireflection layers may be single layers of material, may be multi-layer stacks of multiple materials, may include organic layer(s), may include inorganic layer(s), etc. A shadow mask may be used during physical vapor deposition operations to ensure that the antireflection films are deposited only in areas of display 14 that are associated with windows 90 and not in areas that overlap diodes 26, thereby avoiding interference with the operation of diodes 26. If desired, blanket films may be used in forming the antireflection layers at locations A, B, and C by adjusting the structures of diodes 26. Moreover, different moisture barrier structures may be formed on display 14. The configuration of FIG. 23 is merely illustrative.

Figure 24:
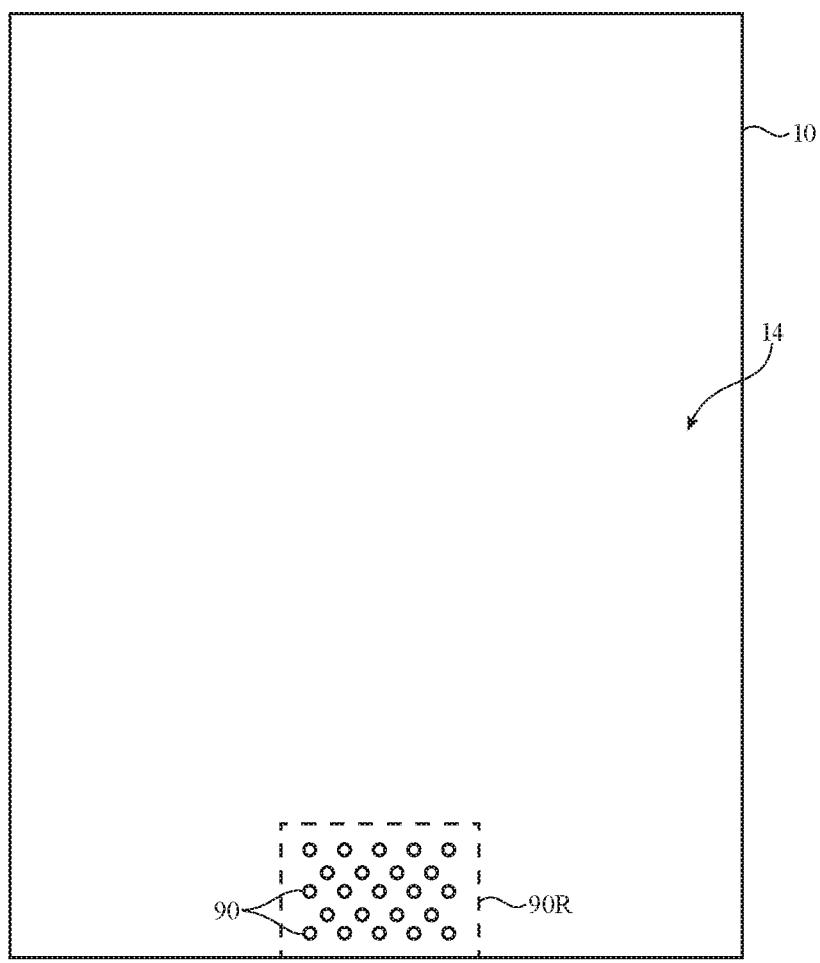
FIG. 24 is a top view of a display showing how a portion of the display may have an array of light transmitting windows in accordance with an embodiment.

If desired, cathode 46 may be locally thinned in a portion of display 14 that overlaps windows 90. Consider, as an example, an arrangement of the type shown in FIG. 24. FIG. 24 is a top view of device 10 in an arrangement in which display 14 covers the front face of device 10. Device 10 may be, for example, a cellular telephone or other portable device. An array of windows 90 may be formed in region 90R of display 14 (e.g., using a rectangular array with rows and columns, using an array in which windows 90 are placed at horizontally staggered locations in successive rows as shown in FIG. 24, or using other suitable array patterns). This allows components 84 on device 82 to form a light-based fingerprint sensor (e.g., a button that senses the presence of a user's finger in region 90R and that captures an image of the fingerprint of the user's finger using light sensors 84 that are aligned with respective windows 90). Region 90R may contain pixels 22 for displaying a portion of the image that is displayed on display 14. To ensure that these pixels receive a desired cathode voltage via cathode layer 46, at least some of cathode layer 46 is preferably present in region 90R. To help enhance light transmission in windows 90, the thickness of cathode layer 46 may be reduced in region 90R relative to the other portions of display 14. As an example, the thickness of cathode 46 in the portions of display 14 that overlap pixels 22 but that do not overlap components 84 may be 20-30 nm, whereas the thickness of cathode 46 in the region of display 14 that overlaps the array of components 84 (and the pixels in that region) may be about 10 nm or less. The lowered thickness of cathode layer 46 will increase the resistivity of cathode layer 46 in region 90R slightly, but voltage variations due to the IR drop across this portion of cathode layer 46 will generally be acceptable, because of the relatively small size of region 90R and the position of region 90R at the lower edge of device 10 where a horizontal metal power supply path may be used to distribute cathode voltage ELVSS to cathode layer 46.

Figure 25:
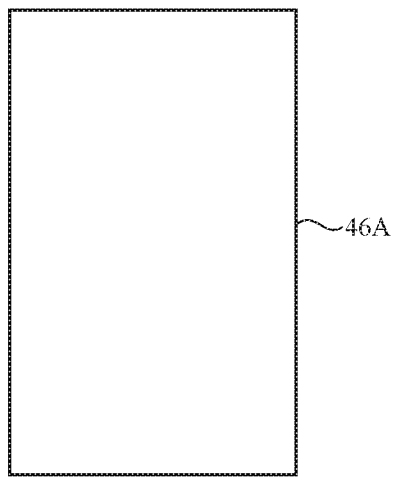
FIGS. 25 and 26 are top views of illustrative patterns that may be used in depositing portions of a cathode in accordance with an embodiment.
Figure 26:
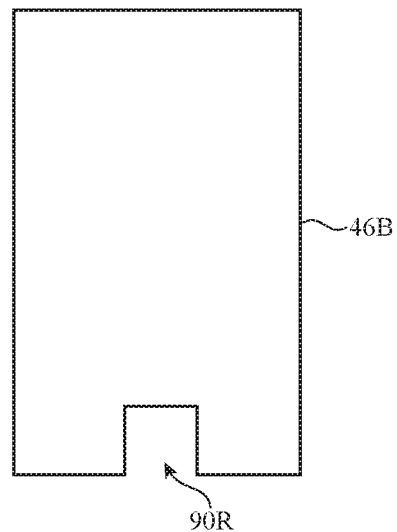
Figure 27:
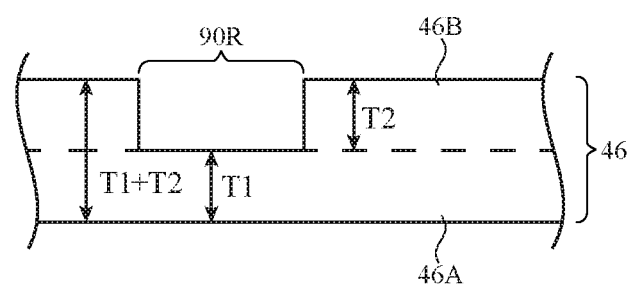
FIG. 27 is a cross-sectional side view of an illustrative cathode layer that has been processed to form a locally thinned region that can overlap an array of light transmitting windows in accordance with an embodiment.

Any suitable cathode patterning technique may be used to form a cathode layer with multiple thicknesses. With one illustrative arrangement, one cathode deposition step is used to deposit a blanket film of cathode material (e.g., cathode layer 46A of FIG. 25) with a thickness T1 over the surface of display 14. Another cathode deposition step, which may be performed before or after the deposition of layer 46A, may be used to deposit another cathode layer (e.g., cathode layer 46B of FIG. 26) with a thickness T2. During the deposition of cathode layer 46B (e.g., using physical vapor deposition techniques), a shadow mask may be used to prevent cathode material from being deposited in region 90R. A cross-sectional side view of the resulting cathode layer (cathode layer 46 of FIG. 27) taken through region 90R is shown in FIG. 27. As shown in FIG. 27, the thickness of cathode 46 is T1+T2 in the portion of display 14 that is not overlapped by region 90R and is thinner (having thickness T1) in the portion of display 14 within region 90R. The relatively small thickness of the cathode material in region 90R may allow high transparency windows 90 to be formed in display 14 within region 90R without requiring that windows 90 be free of cathode material.

Figure 28:
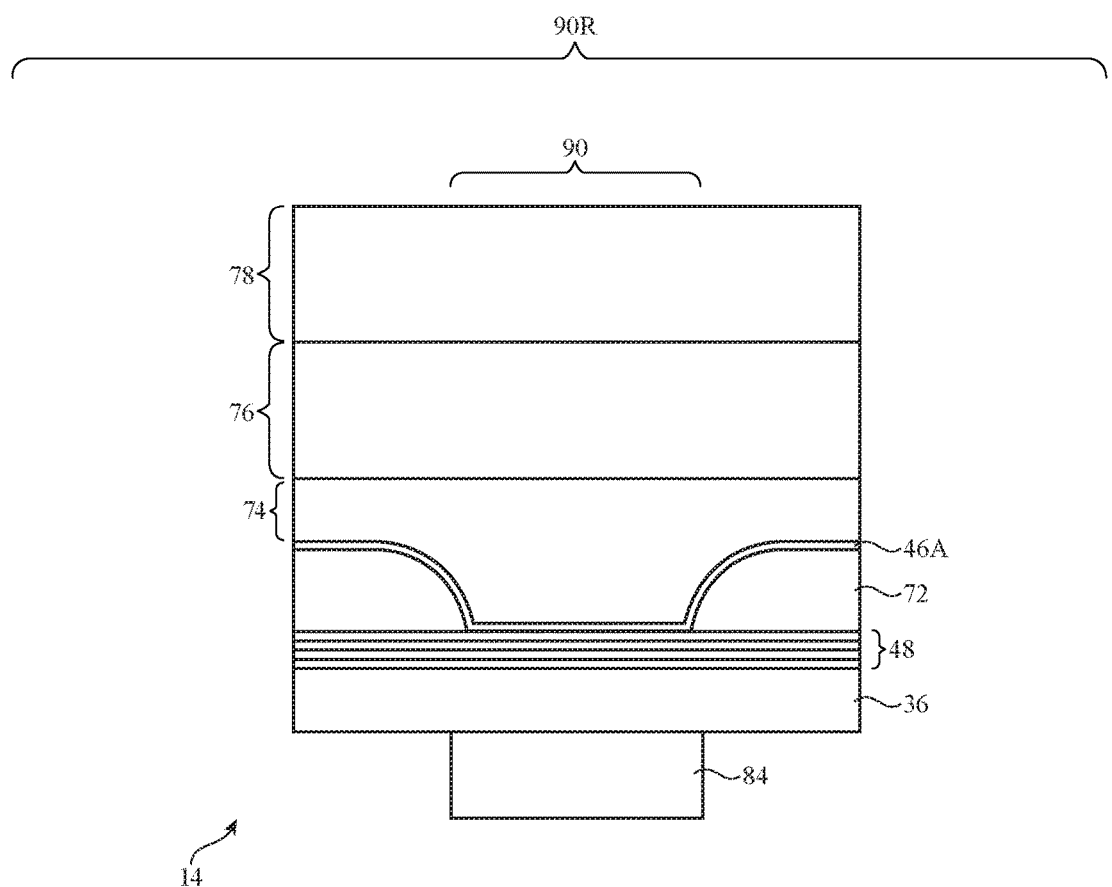
FIG. 28 is a cross-sectional side view of an illustrative light transmitting window that has been formed in a region of a display that has a locally thinned cathode layer in accordance with an embodiment.

A cross-sectional side view of a portion of region 90R in display 14 that has an illustrative window 90 is shown in FIG. 28. Moisture barrier layer 74 of FIG. 28 may be formed using organic capping layer CP and layers MB1, MB2, and MB3 of FIG. 23. If desired, antireflection layers may be incorporated into window 90 of FIG. 28 and other windows 90 in selectively thinned cathode region 90R, as described in connection with FIG. 23.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   a substrate;
   thin-film circuitry on the substrate that comprises an array of light-emitting diodes, wherein the thin-film circuitry includes a cathode layer that overlaps the array of light-emitting diodes and wherein each light-emitting diode includes an anode and includes emissive material interposed between the anode of that light-emitting diode and the cathode layer, wherein the thin-film circuitry comprises a pixel definition layer that has openings, and wherein each of the openings in the pixel definition layer is aligned with a respective one of the anodes; and
   electrical components, wherein the substrate is interposed between the electrical components and the thin-film circuitry, wherein the thin-film circuitry is configured to form light transmitting windows each of which is aligned with a corresponding one of the electrical components, wherein the cathode layer has openings that overlap the light transmitting windows to enhance light transmission through the light transmitting windows, and wherein the light transmitting windows overlap portions of the pixel definition layer without openings.

2. The display defined in claim 1 wherein the electrical components comprise light sensors.

3. The display defined in claim 2 wherein the light sensors are part of an integrated circuit.

4. The display defined in claim 3 wherein the integrated circuit has through-silicon vias and is mounted to a flexible printed circuit.

5. The display defined in claim 2 wherein openings in the cathode layer comprise laser-ablated openings.

6. A display having an array of pixels configured to display images, the display comprising:
   a substrate;
   thin-film circuitry on the substrate that comprises an array of light-emitting diodes, wherein the thin-film circuitry includes a cathode layer that overlaps the array of light-emitting diodes and wherein each light-emitting diode includes an anode and includes emissive material interposed between the anode of that light-emitting diode and the cathode layer; and
   electrical components, wherein the substrate is interposed between the electrical components and the thin-film circuitry, wherein the thin-film circuitry is configured to form light transmitting windows interspersed with at least a portion of the array of pixels, wherein each of the light transmitting windows is aligned with a corresponding one of the electrical components, wherein the windows have antireflection layers, wherein the antireflection layers include at least one inorganic dielectric layer interposed between the cathode layer and the emissive material in the windows.

7. The display defined in claim 6 wherein the electrical components comprise light sensors.

8. The display defined in claim 7 wherein the antireflection layers further includes a second layer between the cathode layer and an organic capping layer and a third layer.

9. The display defined in claim 7 wherein the at least one inorganic dielectric layer is a silicon oxide layer.

10. The display defined in claim 9 wherein the antireflection layers further include at least one silicon nitride layer.

11. The display defined in claim 7 wherein none of the inorganic dielectric antireflection layer is interposed between the cathode layer and the emissive material in the light-emitting diodes.

12. The display defined in claim 7 wherein the cathode layer has a first area that does not overlap the windows and has a second area that overlaps that windows and wherein the cathode layer is thinner in the second area than in the first area.

13. The display defined in claim 12 wherein the light sensors are part of an integrated circuit.

14. The display defined in claim 13 wherein the integrated circuit has through-silicon vias and is mounted to a flexible printed circuit.

15. A display, comprising:
   a substrate;
   thin-film circuitry on the substrate that comprises an array of light-emitting diodes, wherein the thin-film circuitry includes a cathode layer that overlaps the array of light-emitting diodes and wherein each light-emitting diode includes an anode and includes emissive material interposed between the anode of that light-emitting diode and the cathode layer; and
   an array of light sensors, wherein the substrate is interposed between the array of light sensors and the thin-film circuitry and wherein the thin-film circuitry is configured to form light transmitting windows each of which is aligned with a corresponding one of the light sensors, wherein the cathode layer has a first thickness in a first region of the thin-film circuitry that overlaps the array of light sensors and wherein the cathode layer has a second thickness that is greater than the first thickness in a second region of the thin-film circuitry that overlaps the array of light-emitting diodes and does not overlap the array of light sensors.

* * * * *